United States Patent
Arai

(10) Patent No.: US 8,538,346 B2
(45) Date of Patent: Sep. 17, 2013

(54) PHASE NOISE CORRECTION CIRCUIT, TRANSMITTER, RECEIVER, RADIO DEVICE, RADIO COMMUNICATION SYSTEM, AND PHASE NOISE CORRECTION METHOD

(75) Inventor: Jungo Arai, Tokyo (JP)

(73) Assignee: NEC Corporation, Tokyo (JP)

( * ) Notice: Subject to any disclaimer, the term of this patent is extended or adjusted under 35 U.S.C. 154(b) by 542 days.

(21) Appl. No.: 12/746,946

(22) PCT Filed: Dec. 18, 2008

(86) PCT No.: PCT/JP2008/073121
§ 371 (c)(1),
(2), (4) Date: Jun. 9, 2010

(87) PCT Pub. No.: WO2009/081842
PCT Pub. Date: Jul. 2, 2009

(65) Prior Publication Data
US 2010/0261434 A1 Oct. 14, 2010

(30) Foreign Application Priority Data
Dec. 26, 2007 (JP) .................................. 2007-334110

(51) Int. Cl.
*H04B 1/40* (2006.01)

(52) U.S. Cl.
USPC .............. 455/76; 375/233; 375/232; 375/326

(58) Field of Classification Search
USPC ............................ 455/76; 375/233, 232, 326
See application file for complete search history.

(56) References Cited

U.S. PATENT DOCUMENTS 7,580,454 B2 * 8/2009 Carrer et al. .................. 375/233
2003/0007575 A1 * 1/2003 Ohishi .......................... 375/326
2006/0013296 A1 * 1/2006 Carrer et al. .................. 375/232

FOREIGN PATENT DOCUMENTS

| JP | 64-17521 A | 1/1989 |
| JP | 7-46280 A | 2/1995 |
| JP | 7-235954 A | 9/1995 |
| JP | 8-32507 A | 2/1996 |
| JP | 9-74431 A | 3/1997 |
| JP | 11-46156 A | 2/1999 |
| JP | 2000091939 A | 3/2000 |
| JP | 2001053712 A | 2/2001 |
| JP | 2002325028 A | 11/2002 |
| JP | 2003018230 A | 1/2003 |
| JP | 2003289263 A | 10/2003 |
| JP | 2005252602 A | 9/2005 |
| JP | 2007081952 A | 3/2007 |

OTHER PUBLICATIONS

Chinese Office Action for CN200880122807.5 dated on Jul. 26, 2012.
International Search Report for PCT/JP2008/073121 mailed Mar. 17, 2009.
Japanese Office Action for JP2009-547067 issued Dec. 15, 2011.

* cited by examiner

*Primary Examiner* — April G Gonzales

(57) ABSTRACT

An object of the present invention is to sufficiently exhibit carrier reproduction performance in a radio device having a transmitter and a receiver and performing radio communication. A phase noise correction circuit provided in the transmitter in the radio device includes: a phase error information acquisition unit that acquires phase error information detected by a receiver of the radio device; and a phase noise correction unit that performs correction of phase noise generated by a local oscillator shared between the receiver and transmitter for a baseband signal upon radio transmission by using the phase error information acquired by the phase error information acquisition unit.

20 Claims, 11 Drawing Sheets

PHASE NOISE CORRECTION CIRCUIT, TRANSMITTER, RECEIVER, RADIO DEVICE, RADIO COMMUNICATION SYSTEM, AND PHASE NOISE CORRECTION METHOD

This application is the National Phase of PCT/JP2008/073121, filed Dec. 18, 2008, which is based upon and claims the benefit of priority from prior Japanese Patent Application No. 2007-334110 (filed on Dec. 26, 2007) under the Paris Convention, the entire contents of which are incorporated in the present specification by reference.

TECHNICAL FIELD

The present invention relates to a phase noise correction circuit, a transmitter, a receiver, a radio device, a radio communication system, and a phase noise correction method and, more particularly, to a reduction in phase noise generated when frequency conversion between a radio frequency and an intermediate frequency is carried out in radio communication.

BACKGROUND ART

In general, a main function of a demodulator in a radio device that performs radio digital communication is to perform carrier reproduction or clock reproduction under the influence of phasing, etc. which may deteriorate channel quality. Meanwhile, with an increase in the operational frequency of the radio device and a reduction in the price thereof, influence of phase noise caused by an oscillator (local oscillator) incorporated in the radio device exerted on the characteristics of the entire device becomes greater. Under such a circumstance, the demodulator has fallen into a state of not being able to obtain sufficient characteristics under a condition that a degradation component caused by phase noise has been added. As described above, at the present day, the phase noise generated in a local oscillator can be taken as one of the problems that affect the quality of high-frequency digital communication.

For explaining a transmitter used for high-frequency digital communication, schematic configurations of a transmitter and a receiver are illustrated in FIG. 12. FIG. 12A illustrates a configuration of a transmitter, and FIG. 12B illustrates a configuration of a receiver. As illustrated in FIG. 12A, in a transmitter 40, a BB (Base Band) signal 46 is converted into an IF (Intermediate Frequency) signal 47 by an orthogonal modulator 41 and an IF local oscillator 42. Further, the IF signal 47 is converted into an RF signal 48 by an mixer 43 and an RF (Radio Frequency) local oscillator 44 and, finally, the RF signal 48 is output from an antenna 45. On the other hand, as illustrated in FIG. 12B, in a receiver 60, the signal output from the transmitter 40 is received by an antenna 66. Then, an RF signal 67 received by the antenna 66 is converted into an IF signal 68 by an mixer 64 and an RF local oscillator 65 and further converted into a BB signal 69 by an orthogonal demodulator 62 and an IF local oscillator 63.

In this case, four oscillators (RF local oscillators 44 and 64, IF local oscillators 42 and 63) in total are used in the transmitter 40 and receiver 60. The phase noises generated from the four local oscillators are uncorrelated with one another. In the configuration illustrated in FIG. 12, correction of the phase noise is performed at the same time when frequency error between the local oscillators on the transmitter side and receiver side is performed by a carrier reproduction PLL (Phase Locked Loop) 61 after conversion of the received RF signal 67 into the BB signal 69. However, even with such a method, it has been difficult for the reproduction PLL 61 to perform satisfactory correction when a strong phase noise component is present, resulting in degradation in carrier reproduction performance.

As a technique relating to this point, for example, Patent Literature 1 discloses a frequency conversion device in which an increase in frequency accuracy and reduction in the size and cost of the device are achieved. The frequency conversion device generates only some signals of low frequencies among signals of local oscillation frequencies by a phase locked loop according to a beacon signal of intermediate frequency generated by mixing a predetermined beacon signal with a signal of local oscillation frequency. By using the generated signals to perform frequency conversion, this technique aims to cancel frequency error or phase noise generated at the conversion time.

Further, for example, Patent Literature 2 discloses a demodulator including a digital signal generation unit, a timing reproduction unit, a carrier reproduction unit, and a phase noise correction unit. In the demodulator, the phase noise correction unit outputs a phase noise correction signal which has a value of increment in the case of plus increase of the phase difference and has a value obtained by multiplying increment by −1 in the case of minus increase of the phase difference. The carrier reproduction unit sets a gain of the phase difference of the digital signal after timing reproduction based on the phase noise correction signal and rotates a symbol in the phase noise suppressing direction by an oscillation signal oscillated in accordance with the gain to perform carrier reproduction. By adopting the above configuration, this technique aims to improve quality and reliability by efficiently performing correction control of phase noise with high precision.

CITATION LIST

Patent Literature

{PTL 1} JP-A-2000-91939
{PTL 2} JP-A-2003-18230

SUMMARY OF INVENTION

Technical Problem

In a radio device using a phase modulation method such as a QAM (quadrature Amplitude Modulation), simultaneous achievement of both an improvement in performance and reduction in price of a product is desired to be achieved. In view of this, a method for providing quality equivalent to or better than a currently-used product is required even in the case where a device that is more moderate in price but lower in performance than the currently-used device is used. In particular, since the phase noise greatly affects communication quality, various methods for reducing the influence of the phase noise have been studied.

The technique disclosed in Patent Literature 1 generates local oscillation frequency signals having lower frequency by a phase locked loop according to a beacon signal of intermediate frequency and uses the generated signals to perform correction of frequency error. The technique disclosed in Patent Literature 2 sets a gain of the phase difference based on an increase or decrease in the phase difference, and rotates a symbol in the phase noise suppressing direction by an oscillation signal oscillated in accordance with the set gain to perform carrier reproduction.

In both the techniques disclosed in Patent Literature 1 and 2, frequency error correction and phase noise correction are performed by the carrier reproduction PLL of the receiver (phase locked loop in Patent Literature 1, carrier reproduction unit in PTL 2). In order to correct a certain level of phase noise, it is necessary to widen the passband of a loop filter. However, when the passband of a loop filter is widened, noise generated in the carrier reproduction PLL itself is increased, resulting in degradation in carrier reproduction performance. By contrary, when the passband of a loop filter is narrowed in order to improve the carrier reproduction performance, satisfactory correction of the phase noise cannot be achieved, significantly adversely affecting communication quality.

In view of the above situation, an object of the present invention is to provide a phase noise correction circuit, a transmitter, a receiver, a radio device having the transmitter/receiver, and the like capable of sufficiently exhibiting carrier reproduction performance in a transmitter/receiver that performs radio communication.

Solution to Problem

To achieve the above object, a first noise correction circuit according to the present invention includes: a phase error information acquisition unit that is provided in a transmitter of a radio device and acquires phase error information detected by a receiver of the radio device; and a phase noise correction unit that is provided in the transmitter and performs correction of phase noise generated by a local oscillator shared between the receiver and transmitter for a baseband signal upon radio transmission by using the phase error information acquired by the phase error information acquisition unit.

A first transmitter according to the present invention is a transmitter provided in a radio device together with a receiver. The transmitter includes: a local oscillator shared with the receiver; and a phase noise correction circuit including a phase error information acquisition unit that acquires phase error information detected by the receiver and a phase noise correction unit that performs correction of phase noise generated by the local oscillator for a baseband signal upon radio transmission by using the phase error information acquired by the phase error information acquisition unit.

A first receiver according to the present invention is a receiver provided in a radio device together with a transmitter. The receiver includes: a local oscillator shared with the transmitter; and a frequency error correction circuit including a phase error, information detection unit that detects phase error information including phase noise generated by the local oscillator upon radio reception and sends the detected phase error information to a transmitter including a phase noise correction circuit that performs correction of the phase noise generated by the local oscillator for a baseband signal upon radio transmission.

A first radio device according to the present invention is a radio device provided with a transmitter and a receiver. The receiver includes: a first local oscillator shared with the transmitter; and a frequency error correction circuit including a phase error information detection unit that detects phase error information including phase noise generated by the local oscillator upon radio reception. The transmitter includes: the first local oscillator shared with the receiver; and a phase noise correction circuit including a phase error information acquisition unit that acquires the phase error information detected by the phase error information detection unit and a phase noise correction unit that performs correction of the phase noise generated by the first local oscillator for a baseband signal upon radio transmission by using the phase error information acquired by the phase error information acquisition unit.

A first radio communication system according to the present invention is a radio communication system including a plurality of radio devices each having a receiver and a transmitter. The receiver includes a local oscillator shared with the transmitter; and a frequency error correction circuit including a phase error information detection unit that detects phase error information including phase noise generated by the local oscillator upon radio reception. The transmitter includes the local oscillator shared with the receiver; and a phase noise correction circuit including a phase error information acquisition unit that acquires the phase error information detected by the phase error information detection unit and a phase noise correction unit that performs correction of the phase noise generated by the local oscillator for a baseband signal upon radio transmission by using the phase error information acquired by the phase error information acquisition unit.

A first phase noise correction method according to the present invention comprises: at a phase noise correction circuit provided in a transmitter of a radio device, acquiring phase error information detected by a receiver of the radio device; and using the acquired phase-error information to correct phase error generated by a local oscillator shared between the receiver and transmitter for a baseband signal upon radio transmission.

Advantageous Effects of Invention

According to the present invention, in the transmitter/receiver for performing radio communication, phase noise correction performed in the receiver is shared between the transmitter and receiver to allow the receiver to concentrate on frequency error correction, whereby carrier reproduction performance can sufficiently be exhibited.

Figure 1:
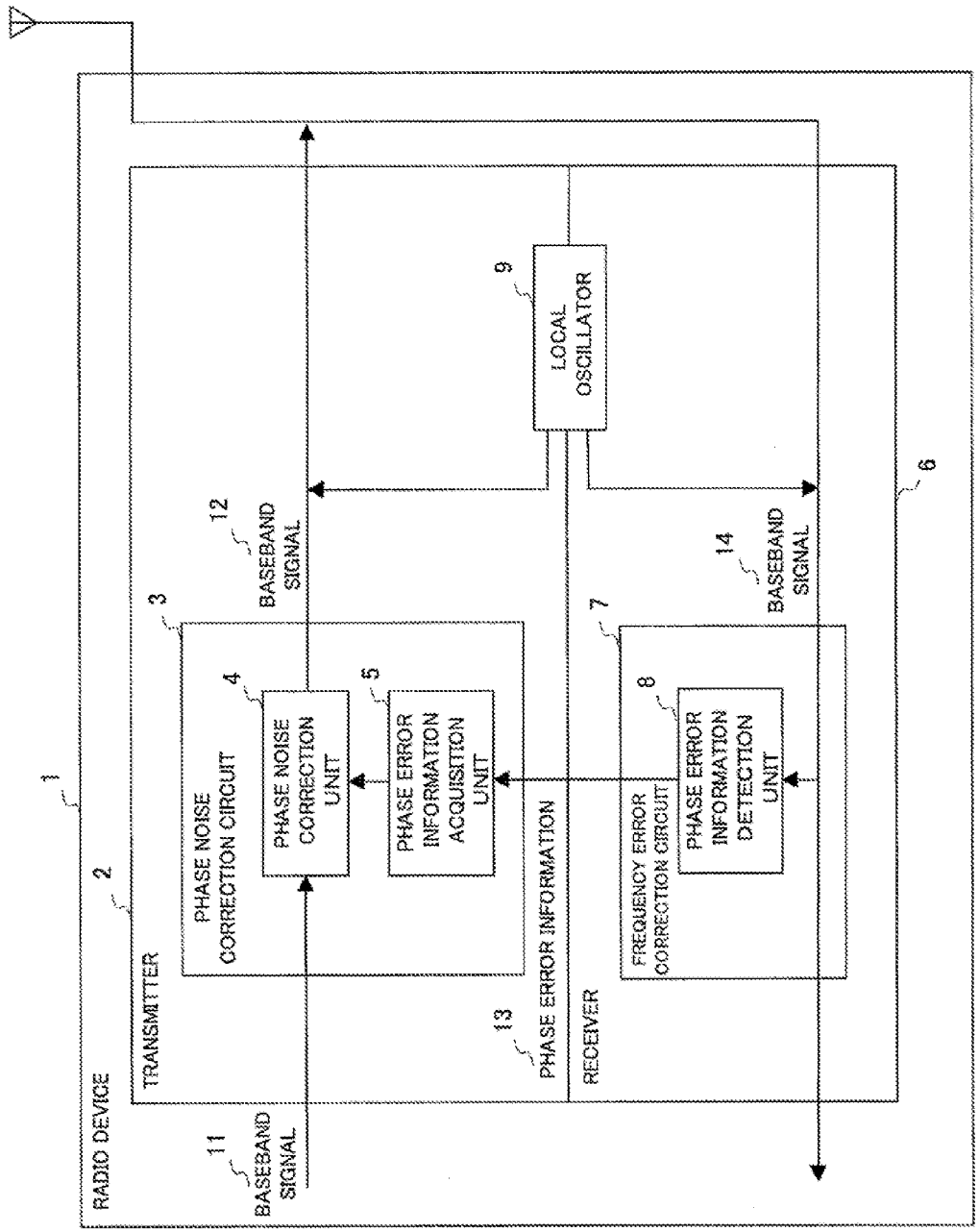
FIG. 1 A view illustrating a schematic configuration of a radio device to which the present invention is applied.

REFERENCE SIGNS LIST 1, 100, 102, 103: Radio device
2, 200, 202: Transmitter
3: Phase noise correction circuit
4: Phase noise correction unit
5: Phase error information acquisition unit
6, 300, 302, 303: Receiver
7: Frequency error correction circuit
8: Phase error information detection unit
9: Local oscillator
11, 12, 14: Baseband signal
13: Phase error information
111, 112, 123, 125: BB signal
113, 122: IF signal
114, 121: RF signal
124: Phase error signal
150: RF local oscillator
160, 230, 330: IF local oscillator
170: Antenna
210: Phase noise corrector
211: Averaging circuit
212: SIN/COS
213, 311: Complex multiplier
220: Orthogonal modulator
240, 340: Mixer
310: Carrier reproduction PLL
312: Carrier phase detector
313: Loop filter
314: Numeric controller oscillator
320: Orthogonal demodulator

DESCRIPTION OF EMBODIMENTS

An exemplary embodiment for practicing the present invention will be described in detail with reference to the accompanying drawings. FIG. 1 illustrates a schematic configuration of the exemplary embodiment of the present invention. As illustrated in FIG. 1, a radio device 1 has a transmitter 2, a receiver 6, and a local oscillator 9. The transmitter 2 and receiver 6 share the local oscillator 9.

The transmitter 2 has a phase noise correction circuit 3 in addition to the local oscillator 9. The phase noise correction circuit 3 has a phase noise correction unit 4 and a phase error information acquisition unit 5.

The receiver 6 has a frequency error correction circuit 7 in addition to the local oscillator 9. The frequency error correction circuit 7 has a phase error information detection unit 8. The receiver 6 mainly performs frequency error correction for a baseband signal 14 obtained by demodulating a radio frequency signal received by radio and uses the phase error information detection unit 8 to detect phase error information 13. The phase error information detection unit 8 sends the detected phase error information 13 to the transmitter 2 side. The transmitter 2 acquires the phase error information 13 sent from the receiver 6 through the phase error information acquisition unit 5 and uses the phase noise correction unit 4 to perform phase noise correction for the baseband signal 11 based on the acquired phase error information 13. Then, the transmitter 2 sends by radio a radio frequency signal obtained by modulating a corrected baseband signal 12.

The present invention has a configuration in which the phase error correction that has ever been carried out only on the receiver side is carried out in the transmitter. More specifically, among the phase noise generated in the transmitter, phase noise generated in the receiver, and frequency error generated in the local oscillator of the transmitter/receiver, the transmitter corrects the phase noise generated in the transmitter itself. That is, the receiver 6 uses the phase error information detection unit 8 to detect phase error information including the phase noise generated by the local oscillator 9 at the time of receiving a radio signal and then sends the detected phase error information to the transmitter 2, and the receiver 6 mainly performs the frequency error correction. The transmitter 2 acquires the phase error information 13 through the phase error information acquisition unit 5 and uses the phase noise correction unit 4 to perform correction of the phase noise generated by the local oscillator 9 at the time of transmitting a radio signal for the baseband signal 11 based on the phase error information 13 including the phase noise generated by the local oscillator 9 at the time of receiving a radio signal. As described above, in the case where radio communication is performed between radio devices each including the transmitter and receiver, communication is made such that a transmitter output of one radio device is received by a receiver of the other radio device, and a transmitter output of the other radio device is received by a receiver of the one radio device.

As described above, in the present invention, the local oscillator is shared by the transmitter and receiver, so that it can be estimated that the phase noise added at the reception time and that added at the transmission time is the same. Thus, in the present invention, by adding, at the transmission time, reverse characteristics of the phase noise detected at the reception time, it is possible to cancel the phase noise generated in the local oscillator. This operation is performed on one radio device and the other radio device and, whereby, the phase noise to be generated at the transmission time can be corrected before actual transmission operation of the transmitter side. Therefore, the phase noise correction which has ever been performed only on the receiver side can be shared between the transmitter and receiver, thereby reducing a load on the receiver side, to allow the receiver to concentrate on the frequency error correction.

Exemplary embodiments of the present invention will be described in more detail below with reference to FIGS. 2 to 11.

First Exemplary Embodiment

Figure 2:
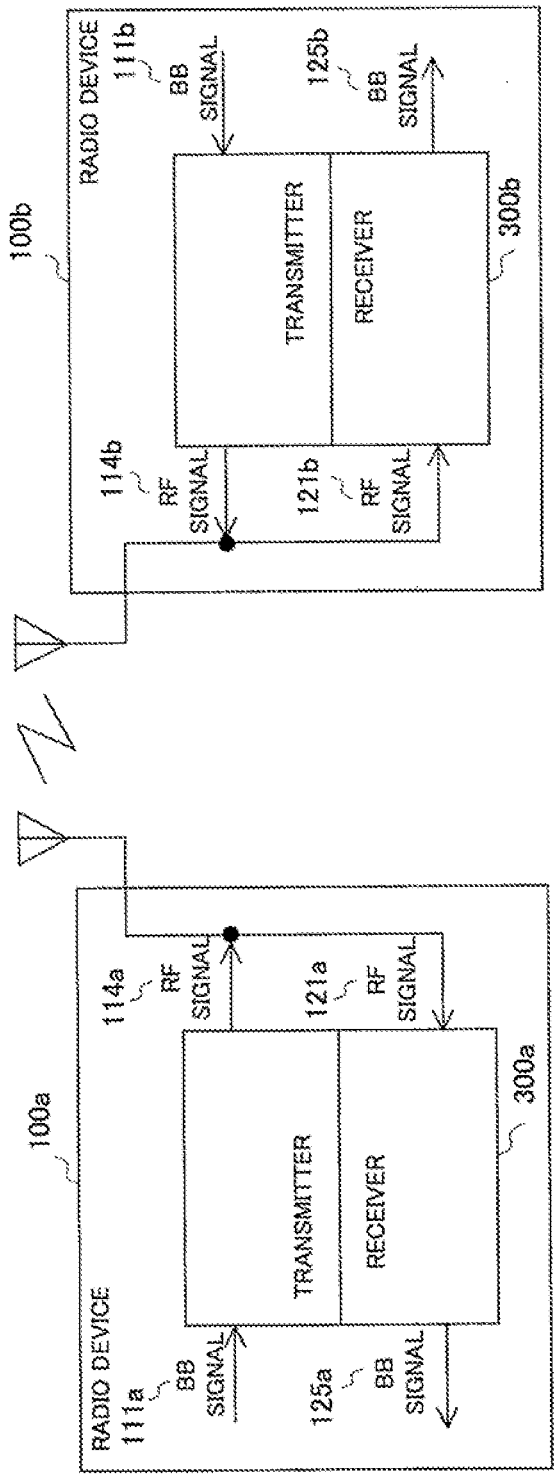
FIG. 2 A view illustrating a configuration of a radio communication system constituted by radio devices according to each of the exemplary embodiments of the present invention.

FIG. 2 is a view illustrating a schematic configuration of a radio communication system constituted by radio devices according to a first exemplary embodiment of the present invention. This radio communication system has radio devices 100a and 100b. The radio devices 100a and 100b are radio devices having the same configuration. The internal configurations of the radio devices 100a and 100b will be described later with reference to FIG. 3. The radio device 100a has a transmitter 200a and a receiver 300a and has a function of performing radio signal transmission and reception. Although not illustrated, the transmitter 200a and receiver 300a share a single local oscillator.

The radio device 100a uses the transmitter 200a to modulate a BB signal 111a and send the modulated BB signal by radio as an RF signal 114*a*, and the radio device 100*b* receives the radio signal. The radio device 100*b* then demodulates an RF signal 121*b* received by a receiver 300*b* to obtain a BB signal 125*b*. The receiver 300*b* performs frequency error correction at the time of the demodulation. Further, the receiver 300 detects phase error information including the phase noise generated by the local oscillator and sends the phase error information to a transmitter 200*b*. When the radio device 100*b* performs radio transmission, the transmitter 200*b* performs phase noise correction for a BB signal 111*b* based on the phase error information acquired by the receiver 300*b*, modulates the resultant signal to obtain an RF signal 114*b*, and sends the RF signal 114*b* by radio. The radio device 100*a* demodulates an RF signal 121*a* received by radio to obtain a BB signal 125*a*.

The received RF signal 121*a* has been subjected to the phase noise correction upon radio transmission by the transmitter 200*b* of the radio device 100*b*, so that the RF signal 121*a* has less phase noise at the time point immediately before radio reception. This is because that the transmitter 200*b* uses the phase noise generated by the local oscillator to perform the phase noise correction upon radio reception so as to add rotation to the BB signal 111*b* in such a manner as to cancel the phase noise to be generated upon radio transmission by the local oscillator. That is, with regard to the phase noise, the receiver 300*a* of the radio device 100*a* needs to cope with only the phase noise generated by the local oscillator of the receiver 300*a* at the time of demodulation of the RF signal 121*a*. Thus, the receiver 300*a* can concentrate on frequency error correction in a state where a target signal has low phase noise, thereby reducing a load on the correction processing performed on the receiver 300*a* side.

Figure 3:
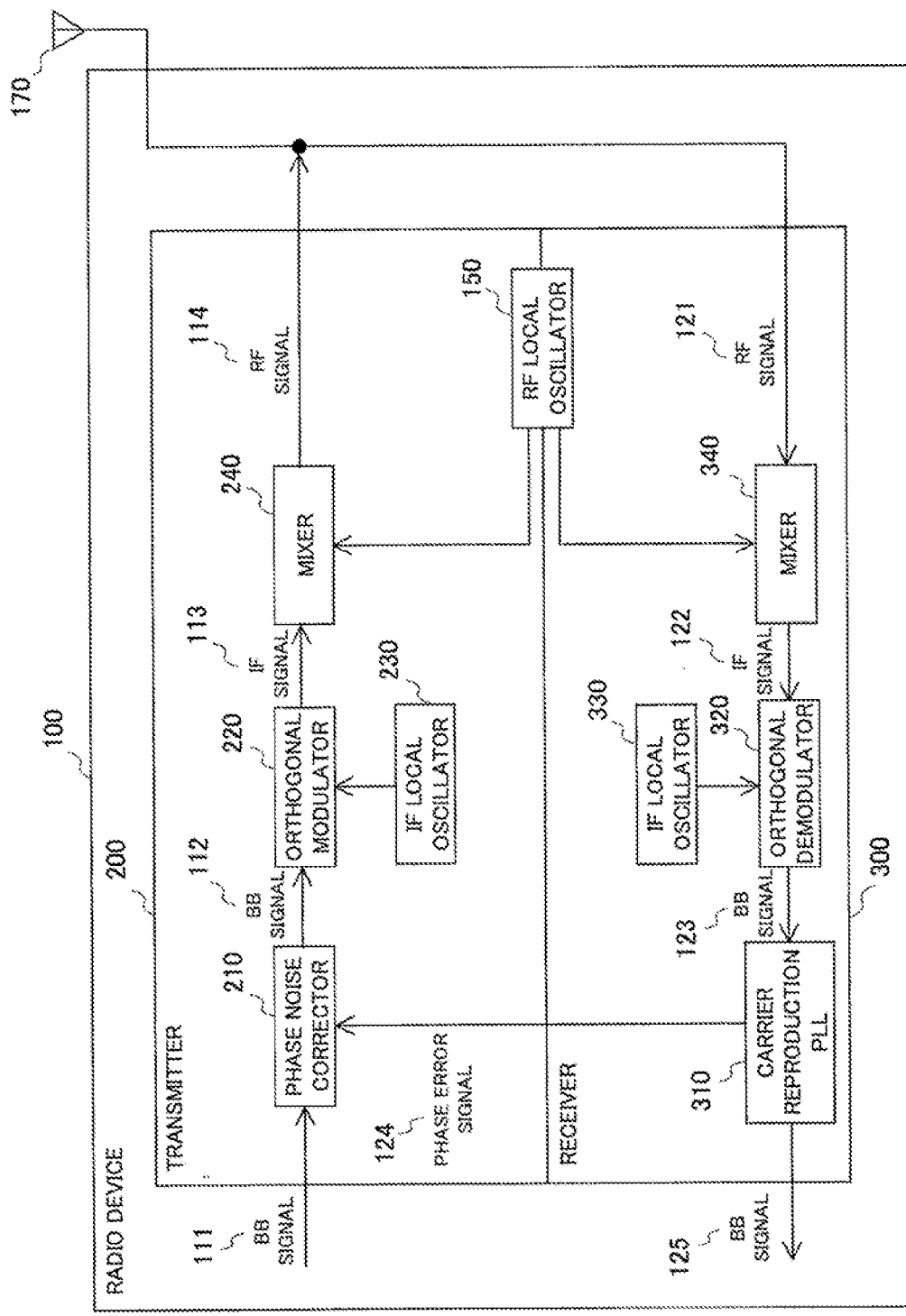
FIG. 3 A view illustrating a schematic configuration of a radio device according to a first exemplary embodiment of the present invention.

FIG. 3 is a schematic view illustrating an internal configuration of a radio device according to the present exemplary embodiment. A radio device 100 has a transmitter 200, a receiver 300, and an antenna 170. The transmitter 200 has a phase noise corrector 210, an orthogonal modulator 220, an IF local oscillator 230, and a mixer 240 and shares an RF local oscillator 150 with the receiver 300. The receiver 300 has a carrier reproduction PLL 310, an orthogonal demodulator 320, an IF local oscillator 330, and a mixer 340 and shares the RF local oscillator 150 with the transmitter 200. The phase noise corrector 210 corresponds to the phase noise correction circuit 3 illustrated in FIG. 1, the carrier reproduction PLL 310 corresponds to the frequency error correction circuit 7 illustrated in FIG. 1, and the RF local oscillator 150 corresponds to the local oscillator 9 illustrated in FIG. 1.

First, the receiver 300 will be described. The receiver 300 receives by radio an RF signal 121 via the antenna 170. Then, the mixer 340 mixes the received RF signal 121 of a radio frequency band and a local signal generated by the RF local oscillator 150. Subsequently, the orthogonal demodulator 320 use a local signal from the IF local oscillator 330 to demodulate an IF signal 122 of an intermediate frequency band obtained by the mixing into a BB signal 123. Finally, the carrier reproduction PLL 310 detects phase error information of the obtained BB signal 123, sends a phase error signal 124 to the transmitter 200, and performs frequency error correction to output a BB signal 125 whose phase noise has been corrected.

Next, the transmitter 200 will be described. The phase noise corrector 210 uses the phase error signal 124 from the receiver 300 to perform phase noise correction for a BB signal 111. Then, the orthogonal modulator 220 uses a local signal generated by the IF local oscillator 230 to modulate a BB signal 112 whose phase noise has been corrected into an IF signal 113 of an intermediate frequency band. Subsequently, the mixer 240 mixes a local signal generated by the RF local oscillator 150 and IF signal 113. Finally, the transmitter 200 sends by radio an RF signal 114 of a radio frequency band obtained by the mixing to an opposing device via the antenna 170.

Figure 4:
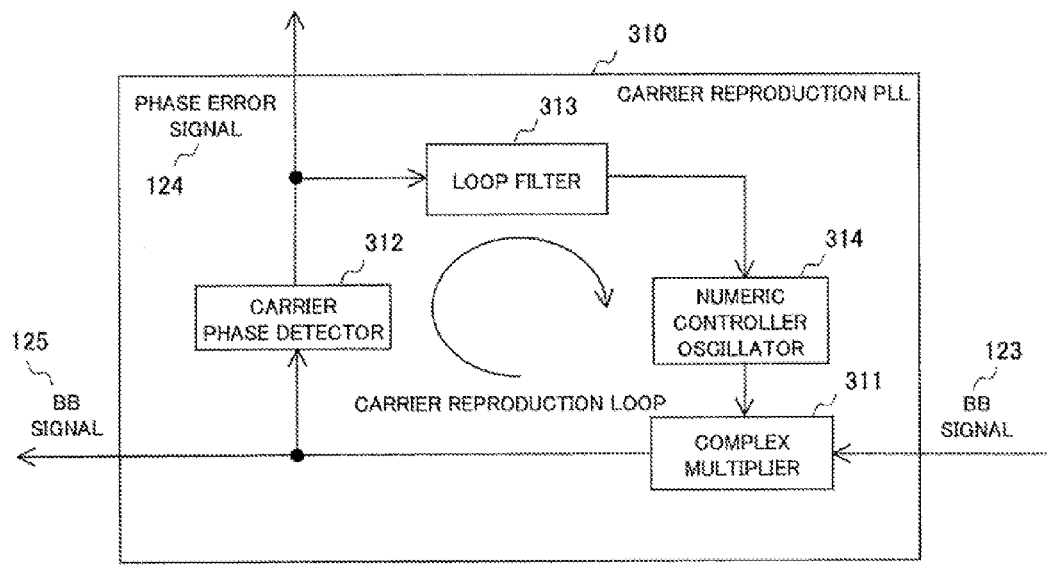
FIG. 4 A view illustrating an internal configuration of a carrier reproduction PLL according to each of the exemplary embodiments of the present invention.

Next, the carrier reproduction PLL 310 of the receiver 300 will be described more in detail. FIG. 4 is a view illustrating an internal configuration of the carrier reproduction PLL 310. The carrier reproduction PLL 300 has a complex multiplier 311, a carrier phase detector 312, a loop filter 313, and a numeric controlled oscillator 314. The carrier phase detector 312 corresponds to the phase error information detection unit 8 illustrated in FIG. 1.

The carrier reproduction PLL performs carrier reproduction as follows. The complex multiplier 311 corrects the carrier phase error of the BB signal 123 obtained by demodulation performed after the signal reception and outputs the resultant signal. Then, the carrier phase detector 312 receives as an input the signal output from the complex multiplier 311 and detects the phase error information. The detected phase error information is input to the loop filter 313 to be used for frequency error correction. Further, the detected phase error information is sent to the phase noise comparator 210 of the transmitter 200 as a phase error signal 124. The phase comparator 210 uses the sent phase error signal 124 to perform phase noise correction for the BB signal upon radio transmission.

The loop filter 313 removes a high-frequency component from the received phase error information and outputs the resultant phase error information to the numeric controlled oscillator 314 as frequency information (concerning frequency error or phase noise). Subsequently, the numeric controlled oscillator 314 selects SIN and COS that give a phase rotation to the BB signal based on the frequency information generated by the loop filter 313 and outputs the selected SIN and COS to the complex multiplier 311. By using the SIN and COS received from the numeric controlled oscillator 314, the complex multiplier 311 performs frequency error correction In the carrier reproduction PLL 310, the above carrier reproduction loop is repeated until the frequency error generated by the local oscillator is eliminated, and the BB signal 125 after correction is output. As described above, in the present exemplary embodiment, the carrier reproduction PLL 310 uses the numeric controlled oscillator 314 to perform frequency error as a quasi-synchronous detection method.

Figure 5:
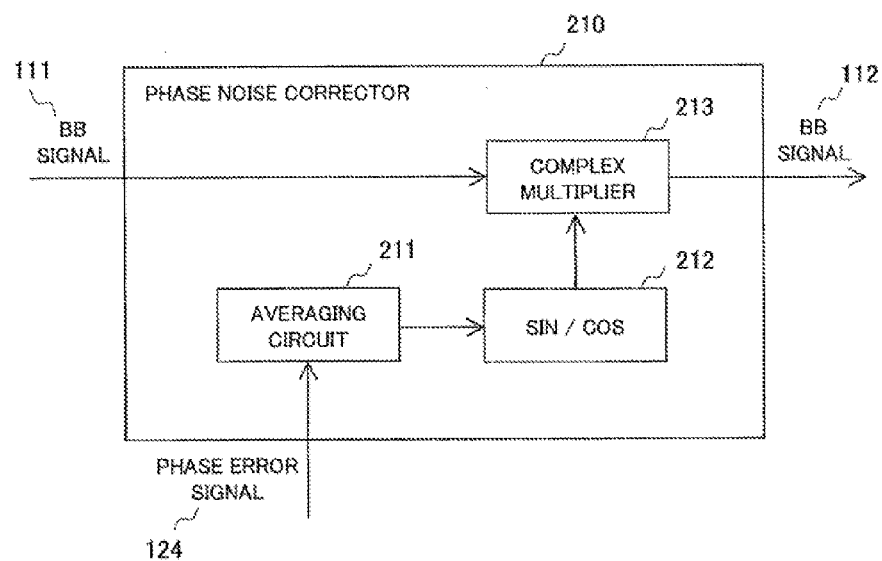
FIG. 5 A view illustrating an internal configuration of a phase noise corrector according to each of the exemplary embodiments of the present invention.

Next, the phase noise corrector 210 of the transmitter 200 will be described more in detail. FIG. 5 is a view illustrating an internal configuration of the phase noise corrector 210. The phase noise corrector 210 has an averaging circuit 211, a SIN/COS 212, and a complex multiplier 213. The averaging circuit 211 and SIN/COS 212 correspond to the phase error information acquisition unit 5 illustrated in FIG. 1 and the complex multiplier 213 corresponds to the phase noise correction unit 4 illustrated in FIG. 1.

The phase noise corrector 210 performs phase noise correction as follows. The averaging circuit 211 extracts phase noise from the phase error signal 124 sent from the carrier reproduction PLL 310 of the receiver 300. The phase noise information detected by the carrier phase detector 312 mainly includes phase noise and thermal noise. Thus, the averaging circuit 211 extracts the phase noise while reducing the thermal noise. The averaging circuit 211 outputs the extracted phase noise to the SIN/COS 212. The output of the averaging circuit 211 represents the phase rotation angle of the averaged phase noise, and the SIN/COS 212 selects SIN and COS that give a phase rotation and outputs the selected SIN and COS to the complex multiplier 213. The complex multiplier 213 gives a reverse direction rotation to the input SIN and COS to the BB signal 111 to be sent by radio to correct the phase noise. As described above, the phase noise corrector 210 takes charge of part of the phase noise correction which has ever been performed on the receiver side together with the frequency error correction to thereby correct the phase noise generated by the local oscillator upon radio transmission.

Next, operation of correcting the frequency error and phase noise in the present exemplary embodiment will concretely be described. As illustrated in FIG. 3, in the present exemplary embodiment, three oscillators: IF local oscillator 230, IF local oscillators 330, and RF local oscillator 150 are provided in a single radio device. The IF local oscillator 230 is an oscillator used for modulating the BB signal 112 into IF signal 113. The IF local oscillator 330 is an oscillator used for demodulating the IF signal 122 into BB signal 123. The RF oscillator 150 is an oscillator used for performing frequency conversion from the IF signal 113 to RF signal 114 and frequency conversion from the RF signal 121 to IF signal 122. The signals generated by the three local oscillators include phase noise components uncorrelated with one another. However, the IF local oscillators 230 and 330 have generally a sufficiently lower frequency than the frequency of the RF local oscillator 150, so that the phase noises generated by the IF local oscillators 230 and 330 are sufficiently low. Thus, the present exemplary embodiment mainly aims to correct the phase noise generated in the RF local oscillator 150.

Figure 6:
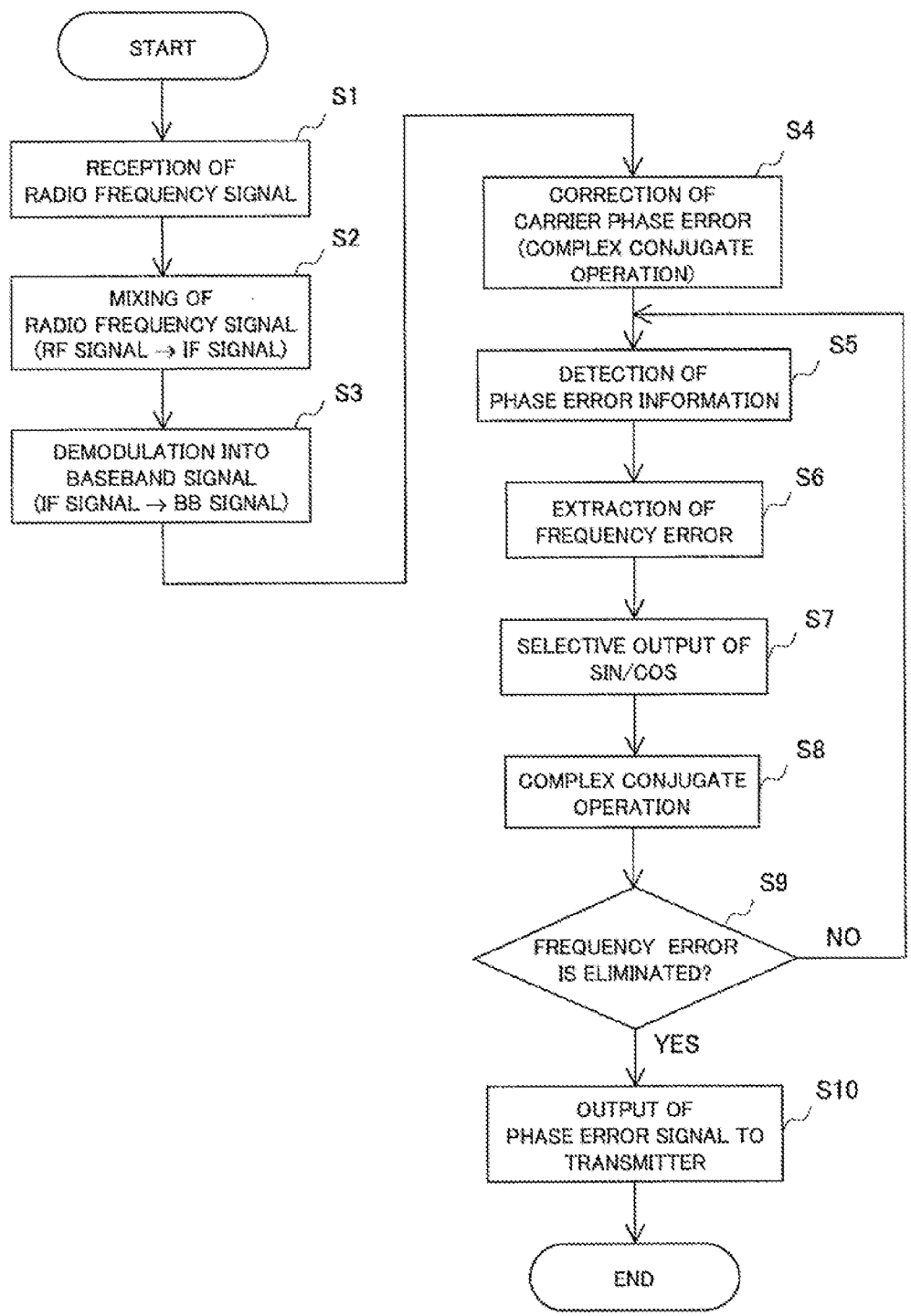
FIG. 6 A flowchart illustrating a flow of frequency error correction operation in each of the exemplary embodiments of the present invention.

First, the frequency error correction operation performed by the carrier reproduction PLL 310 will be described using FIG. 6 with reference to FIGS. 3 and 4. FIG. 6 is a flowchart illustrating a flow of the frequency error correction operation in the present exemplary embodiment. As described above, the carrier reproduction PLL 310 mainly aims to correct the frequency error generated in the local oscillator provided in the transmitter/receiver.

The radio device 100 receives the RF signal 121 of a radio frequency band via the antenna 170 (step S1). Then, the mixer 340 mixes the received RF signal 121 and local signal from the RF local oscillator 150 to perform frequency conversion into the IF signal 122 (step S2). Subsequently, the orthogonal demodulator 320 uses the local signal from the IF local oscillator 330 to demodulate the IF signal 122 into BB signal 123 (step S3). Subsequently, the complex multiplier 311 corrects the carrier phase error of the BB signal 123 obtained by the demodulation and outputs the resultant signal to the carrier phase detector 312 (step S4).

As described later, the complex multiplier 311 is used for removing the frequency error which remains in the BB signal 123 under normal circumstances by the carrier reproduction loop. To this end, the complex multiplier 311 performs complex conjugate operation between a complex vector of the BB signal 123 before correction and a phase error complex vector included in the BB signal 123 calculated in the carrier reproduction PLL 310 (numeric controlled oscillator 314). For the BB signal 123 input for the first time, initial setting values of the SIN and COS are used to perform the complex conjugate operation, and the BB signal 123 after correction is output. The initial setting values are 0 in general, so that the BB signal 123 that has not been substantially corrected is output to the carrier phase detector 312 in the first carrier phase error correction.

Referring back to the flow of FIG. 6, after the carrier phase error has been corrected in the complex multiplier 311, the carrier phase detector 312 detects phase error information and outputs the detected phase error information to the loop filter 313 (step S5). The loop filter 313 then extracts frequency information corresponding to a low frequency component from the phase error information detected by the carrier phase detector 312 and outputs the extracted frequency information to the numeric controlled oscillator 314 (step S6). Subsequently, the numeric controlled oscillator 314 selects SIN and COS that give a phase rotation to the BB signal 123 based on the frequency information input from the loop filter 313 and outputs the selected SIN and COS to the complex multiplier 311 (step S7). Subsequently, the complex multiplier 311 performs complex conjugate operation and gives a reverse direction rotation to the input SIN and COS to the BB signal 123 to correct the frequency error (step S8).

The carrier phase detector 312 compares reference data of the BB signal 123 and actual measurement data thereof (BB signal 123 before correction) and detects the difference between them as error information. In the present exemplary embodiment, frequency error correction using a known signal (beacon signal) as disclosed in PTL 1 is not performed. Instead, a modulation method such as a 128 QAM is adopted in the present exemplary embodiment. Concretely, detection of the phase error information is performed as follows. First, ideal signal data (reference data) are generated from a plurality of reception signal by estimating the reception points of the respective reception signals and grasping the trend of a transmission state. In grasping the trend of a transmission state, correction is performed so as to allow each of the reception signals to reach any of the estimated reception points. Subsequently, when a signal corrected by an error detection function, etc. is determined to be correct, the difference between the ideal signal data and actual signal data is calculated at each reception point as an error. In the case where the frequency error correction or phase noise correction in the present exemplary embodiment is performed ideally, the phase noise generated in the transmitter is corrected in the transmitter itself, and the frequency error generated in the local oscillator provided in the transmitter/receiver is corrected by the carrier reproduction PLL. Thus, ultimately, the phase error information detected in the carrier reproduction PLL becomes the phase noise generated in the receiver. In the present embodiment, this detected phase noise is used to perform the phase noise correction in the transmitter.

The phase error information, thus detected in the carrier phase detector 312 mainly includes frequency error, phase noise, thermal noise that could have not been removed by correction performed in the complex multiplier 311 and phase error components thereof and is output as angle information. The loop filter 313 removes high-frequency phase noise and high-frequency thermal noise from the above phase error components, and takes out therefrom only frequency error and phase noise of a sufficiently low frequency band for the frequency error correction. Originally, the carrier reproduction loop is aimed at correcting the frequency error generated in the local oscillator provided in the transmitter/receiver. The frequency error is not large in time variation, so that the passband of the loop filter used in the carrier reproduction loop may be set to a narrow band. In addition, the frequency error correction is performed for a lower frequency and narrower band signal than that in the phase noise correction, so that the passband of the loop filter used in the carrier reproduction loop can be set to a low frequency band. Considering the above two points, it is possible to set the passband of the loop filter used in the carrier reproduction loop to a low frequency and narrower band. Actually, however, considering a degradation in signal characteristics caused by the phase noise, the passband of the loop filter is forced to be widen for countermeasure against the phase noise at the risk of degrading the carrier reproduction performance. In the present exemplary embodiment, the phase noise generated in the transmitter is corrected in the transmitter itself, so that the receiver needs to address only the phase noise generated in the receiver itself. Therefore, the phase noise that the receiver needs to correct is significantly small, making it possible to set the passband of the loop filter to a sufficiently low frequency band but enough for the frequency error correction.

Based on the frequency error of a low frequency thus extracted by the loop filter, the numeric controlled oscillator 314 outputs the SIN and COS that give a phase rotation to the BB signal 123. The numeric controlled oscillator 314 is aimed at correcting frequency error. Thus, even in a stable state obtained by correcting originally existing frequency error, the numeric controlled oscillator 314 needs to constantly perform oscillation. For example, in the case where original frequency error is 1 Hz and operating clock is 4 Hz, the COS and SIN output from the numeric controlled oscillator 314 repeat (1,0), (0, j), (−1,0), (0,−j). Further, in the case where a signal input to the complex multiplier 311 is (1, j), (−1, j), (−1,−j), (1,−j) including a frequency error component, the complex multiplier 311 performs complex conjugate operation according to the following expression to thereby remove the frequency error component. In this description, the frequency error correction is performed; actually however, the low frequency phase noise extracted by the loop filter 313 is corrected together with the frequency error.

$$(1,j)*\overline{(1,0)}=1*1+1*j=(1,j)$$

$$(-1,j)*\overline{(1,0)}=-1*(-j)+j*(-j)=(1,j)$$

$$(-1,-j)*\overline{(-1,0)}=-1*(-1)+(-j)*(-1)=(1,j)$$

$$(1,-j)*\overline{(0,-j)}=1*j+(-j)*j=(1,j) \quad \text{[Numeral 1]}$$

Referring back to the flow of FIG. 6, in the case where the frequency error added to the received BB signal 123 is not eliminated even after the frequency error correction has been performed by the complex conjugate operation of the complex multiplier 311, (NO in step S9), the carrier phase detector 312 detects the phase error information. Then, the carrier reproduction loop (steps S5 to S8) is continued. On the other hand, in the case where the frequency error added to the received BB signal 123 is eliminated (YES in step S9), it is recognized that radio reception has been normally made. Then, the phase error information detected by the carrier phase detector 312 is sent to the transmitter side as the phase error signal 124 (step S10).

Figure 7:
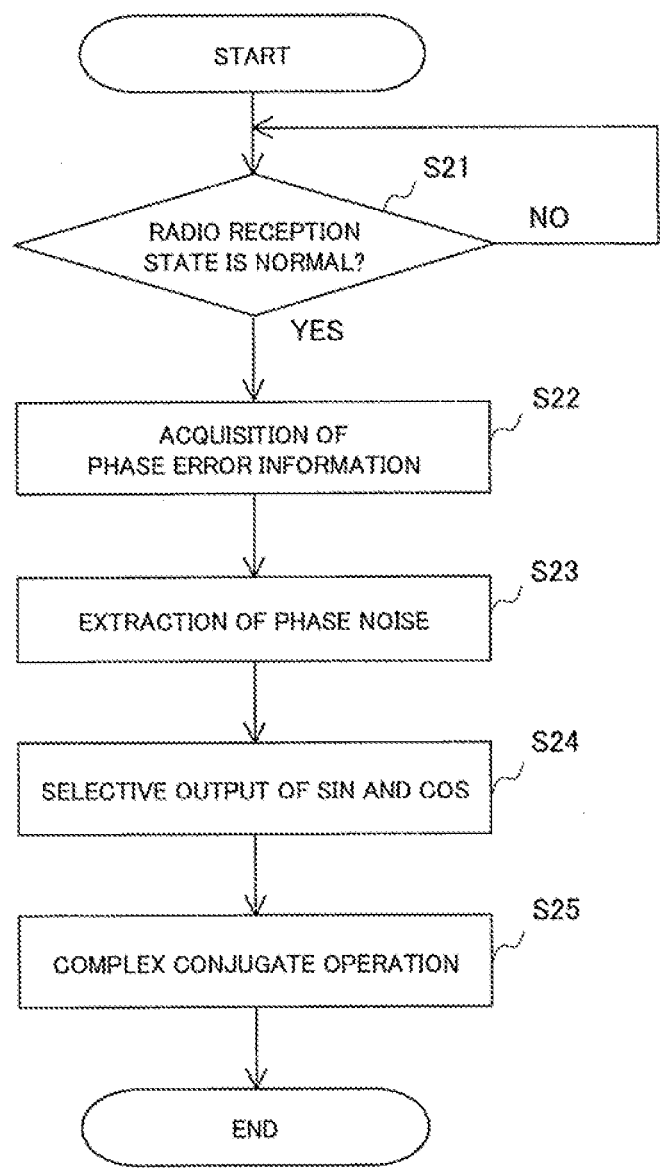
FIG. 7 A flowchart illustrating a flow of the phase noise correction operation in each of the exemplary embodiments of the present invention.

Next, operation of correcting the phase noise performed by the phase noise corrector 210 will be described using FIG. 7 with reference to FIGS. 3 and 5. FIG. 7 is a flowchart illustrating a flow of the phase noise correction operation in the present exemplary embodiment. The phase noise corrector 210 is aimed at performing correction of the phase noise generated in the transmitter on the transmitter side, which has ever been performed on the receiver side.

When a radio reception state is normal (YES in S21), the averaging circuit 211 receives as an input the phase error signal 124 detected by and sent from the carrier phase detector 312 and acquires phase error information (step S22). The averaging circuit 211 performs time averaging processing to thereby extract phase noise from the acquired phase error information that mainly includes phase noise and thermal noise (step S23). The extracted phase noise is output to the SIN/COS 212. The SIN/COS 212 selects SIN and COS that give a phase rotation to the BB signal 111 based on the input phase noise and outputs the selected SIN and COS to the complex multiplier 213 (step S24). Subsequently, the complex multiplier 213 performs complex conjugate operation and gives a reverse direction rotation to the input SIN and COS to the BB signal 111 to correct the phase noise (step S25).

The loop filter 313 is aimed at extracting the frequency error and phase noise generated in the receiver from the phase error information, while the averaging circuit 211 is aimed at estimating phase noise that will be added upon radio transmission from the phase noise generated in the receiver. Further, the phase error signal input to the loop filter 313 and phase error signal sent to the averaging circuit 211 are the same as the phase error signal detected and output by the carrier phase detector 312. The loop filter 313 extracts the frequency error and phase noise generated in the receiver, and the averaging circuit 211 extracts the phase noise generated in the receiver. In extracting the phase noise, the averaging circuit 211 performs time averaging processing for the input phase error signal.

Figure 8:
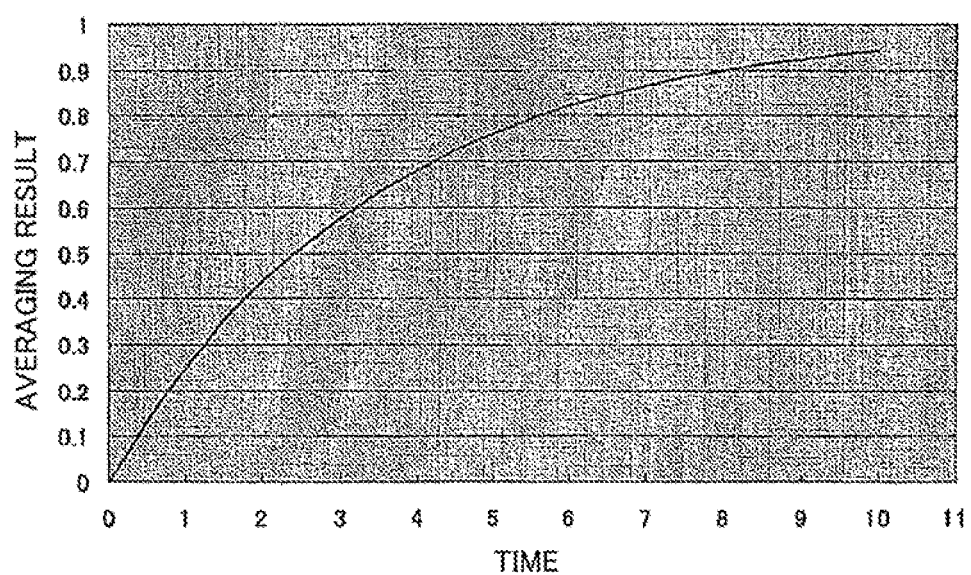
FIG. 8 A view for explaining phase noise extraction processing (time averaging processing) in each of the exemplary embodiments of the present invention.

The reason that the averaging circuit 211 performs the time averaging processing is as follows. The input phase error signal mainly includes the phase noise and thermal noise. Since the phase noise corrector 210 is aimed at correcting the phase noise, unnecessary thermal noise needs to be removed. It is known that, in general, the thermal noise is uncorrelated with time, so that it is effective to calculate time average in order to reduce influence of the thermal noise. On the other hand, the change rate of the phase noise is sufficiently smaller than the symbol rate, so that information of the phase noise is left remained even if the time average is taken. Thus, the averaging circuit 211 performs the time averaging processing for the phase error signal including the phase noise and thermal noise to thereby extract only the phase noise while removing the thermal noise. The concept of the time averaging is as follows. Strictly speaking, data of all samples are required for average calculation. However, resources are limited in the case where the present exemplary embodiment is implemented by hardware, software, or a combination thereof, so that all the sample data cannot be retained. Thus, average data is acquired by calculating the average between an immediately preceding averaging result and newly input data. Assuming that the average is calculated between an immediately preceding averaging result and newly input data in one-to-one ratio and that the initial value input to the averaging circuit is 0 and subsequent input data are consecutive 1's, the first averaging result is (0+1)/2=0.5. When this operation is sequentially performed, the averaging results are represented as illustrated in the graph of FIG. 8. The actual averaging processing is performed while changing the addition ratio between the averaging result and newly input data.

The phase noise thus extracted by the averaging circuit 211 is input to the SIN/COS 212. The SIN/COS 211 then outputs SIN and COS that give a phase rotation to the BB signal 111. The output from the averaging circuit 212 is angle information representing the average angle of the phase rotation error caused by phase noise, and the SIN/COS 212 uses a conversion table to convert the angle information into SIN and COS. The functions of the SIN/COS 212 and numeric controlled oscillator 314 are the same in that they output data of the SIN and COS. However, the SIN/COS 212 is aimed at generating data for phase noise correction, so that, unlikely the numeric controlled oscillator 314, the SIN/COS 212 need not constantly perform oscillation. For example, the phase noise is fixed at π/2, the COS and SIN output by the SIN/COS 212 is always (0, 1). Then, the complex multiplier 213 performs complex conjugate operation between an input signal including no frequency component and the above (0, 1) to thereby obtain a −π/2 corrected output. Like the complex multiplier 311, the complex multiplier 213 performs complex conjugate operation to thereby give a reverse direction rotation to the input SIN and COS to the baseband signal.

According to the present exemplary embodiment, out of the three correction operations (correction of phase noise generated in the transmitter, correction of phase noise generated in the receiver, and correction of frequency error caused by the local oscillator in the transmitter/receiver) all of which have ever been performed on the receiver side, the phase noise generated in the transmitter is corrected on the transmitter side. Thus, with regard to the phase noise, the receiver side needs to correct only the phase noise generated in the receiver side, thereby creating an environment in which carrier reproduction PLL can easily bring out its original function (function of correcting the frequency error). Further, the phase noise generated in the transmitter is corrected on the side of the transmitter itself, that is, the phase noise correction which has ever been performed only on the receiver side is shared between the transmitter and receiver, thereby reducing a load on the receiver.

Further, according to the present exemplary embodiment, the phase noise correction function is separated such that, out of the frequency error correction and phase noise correction which have ever been performed on the receiver side, that part (correction of phase noise generated in the transmitter) of the phase noise correction is performed on the transmitter side, so that the amount of phase noise to be corrected by the receiver side is significantly reduced. As a result, an improvement in the accuracy of the phase noise correction can be expected. Further, the significant reduction in the amount of phase noise to be corrected by the receiver side together with frequency error makes it possible to narrow the passband of the loop filter of the carrier reproduction PLL for the purpose of targeting a sufficiently low frequency band for frequency error correction. Therefore, accuracy of the frequency error correction becomes improved and, accordingly, an improvement in the carrier reproduction performance can be expected.

Further, in the present embodiment, a known signal (e.g., beacon signal) as disclosed in Patent Literature 1 is not used for correcting the frequency error and phase noise. Therefore, it is not necessary to allocate a dedicated frequency to the known signal, thereby maintaining a favorable state without degrading frequency use efficiency.

Second Exemplary Embodiment

Figure 9:
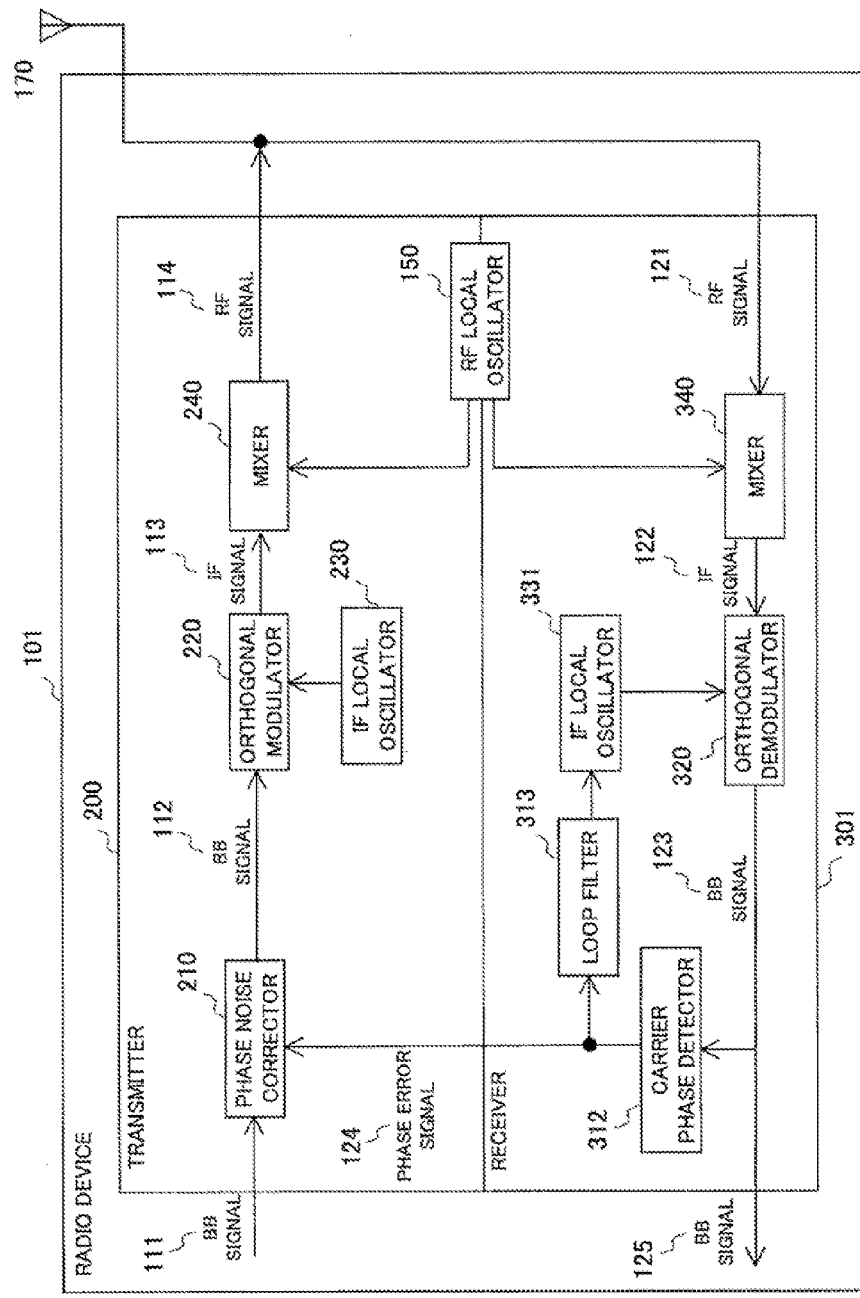
FIG. 9 A view illustrating a schematic configuration of a radio device according to a second exemplary embodiment of the present invention.

The first exemplary embodiment adopts a quasi-synchronous detection method that uses the numeric controlled oscillator for correction of the frequency error caused by the local oscillator provided in the transmitter/receiver. As another example, a second exemplary embodiment adopts a synchronous detection method as illustrated in FIG. 9. A radio device 101 according to the present exemplary embodiment has a transmitter 200 and a receiver 301. The transmitter 200 has the same configuration of the transmitter 200 of the first exemplary embodiment. The receiver 301 does not have a carrier reproduction PLL provided with the numeric controlled oscillator but uses the carrier phase detector 312, loop filter 313, and an IF local oscillator 331 to perform frequency error correction. In the present exemplary embodiment, a configuration for performing the frequency error correction in the receiver is different from that in the first exemplary embodiment.

The phase noise correction performed in the transmitter side is the same as that in the first exemplary embodiment. That is, the carrier phase detector 312 of the receiver 301 detects phase error information of the BB signal 123 obtained by demodulation performed by the orthogonal demodulator 320 and outputs the detected phase error information to the phase noise corrector 210 as a phase error signal 124. The phase error information thus detected mainly includes phase error components such as frequency error, phase noise, thermal noise that could have not been removed by the orthogonal demodulator 320 and is output as angle information. By inputting the angle information to the phase noise corrector 210 of the transmitter 200, it is possible to obtain the same advantage as that obtained by the phase noise correction according to the quasi-synchronous detection method of the first exemplary embodiment.

The frequency error correction in the receiver 301 is performed as follows. The loop filter 313 extracts frequency error of a low frequency from the phase error information detected by the carrier phase detector 312 and outputs the extracted frequency error to the IF local oscillator 331. Then, the IF local oscillator 331 adjusts the frequency to be oscillated based on the frequency error input from the loop filter 313 and oscillates a local signal of a frequency after the adjustment. The IF local oscillator 331 in the present exemplary embodiment employs a frequency variable configuration and has therein a controller for performing frequency adjustment based on the frequency error. The orthogonal demodulator 320 uses the local signal after the adjustment from the IF local oscillator 331 and the IF signal 122 to perform signal demodulation into the BB signal 123.

Since the synchronous detection method is adopted in the present exemplary embodiment, frequency oscillation control is performed for the IF local oscillator that adds a local signal in which the frequency error is inherent. Thus, it is possible to directly correct the frequency error in such a manner as to prevent the frequency error from being generated in the IF local oscillator. Further, in the present embodiment, the number of components can be reduced more than in the first exemplary embodiment, thereby further simplifying the configuration.

Third Exemplary Embodiment

Figure 10:
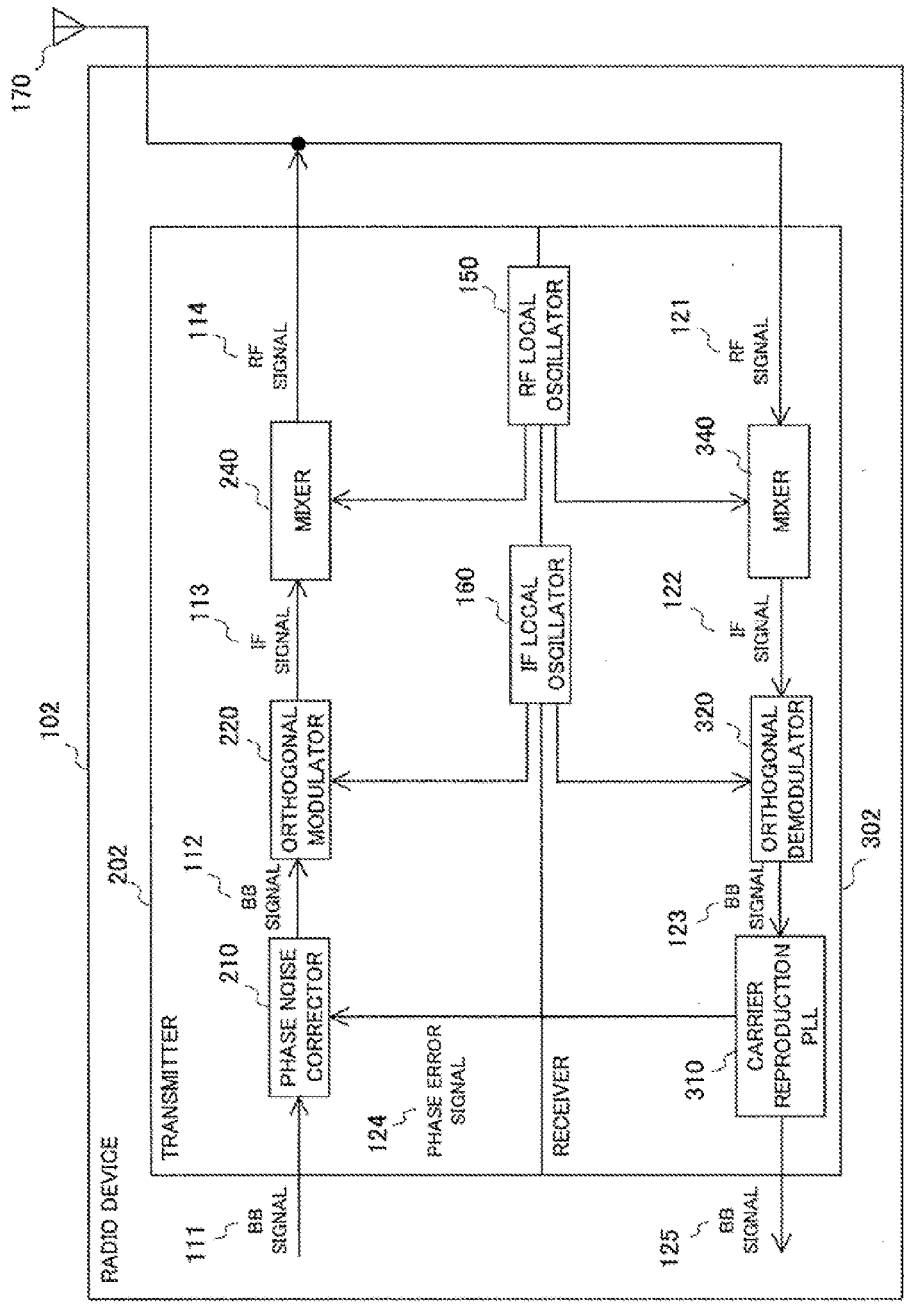
FIG. 10 A view illustrating a schematic configuration of a radio device according to a third exemplary embodiment of the present invention.

Although, in the first exemplary embodiment, the RF local oscillator 150 is shared as illustrated in FIG. 3, a configuration may be adopted in which not only the RF local oscillator but also the IF local oscillator is shared. In a third exemplary embodiment, a transmitter 202 and a receiver 302 of a radio device 102 share the RF local oscillator 150 and an IF local oscillator 160 as illustrated in FIG. 10.

In this case, the phase noise corrector 210 of the transmitter 202 corrects the phase error generated in the IF local oscillator 160 in addition to the phase error generated in the RF local oscillator 150. However, the phase noise generated in the IF local oscillator 160 is sufficiently smaller than the phase noise generated in the RF local oscillator 150, so that even in the configuration where the IF local oscillator is shared, the same phase noise correction effect as obtained by the correction method of the first exemplary embodiment can be obtained.

In the present exemplary embodiment, the IF local oscillator is shared between the transmitter and receiver, so that the same frequency is oscillated from the transmitter and receiver. This eliminates error in the frequency oscillated from the IF local oscillator which is generated between the transmitter and receiver (that is, the number of elements to be corrected is reduced), thereby improving the accuracy of the frequency error correction and phase noise correction. Further, in the present exemplary embodiment, the number of components can be reduced more than in the second exemplary embodiment, thereby further simplifying the configuration.

Fourth Exemplary Embodiment

Figure 11:
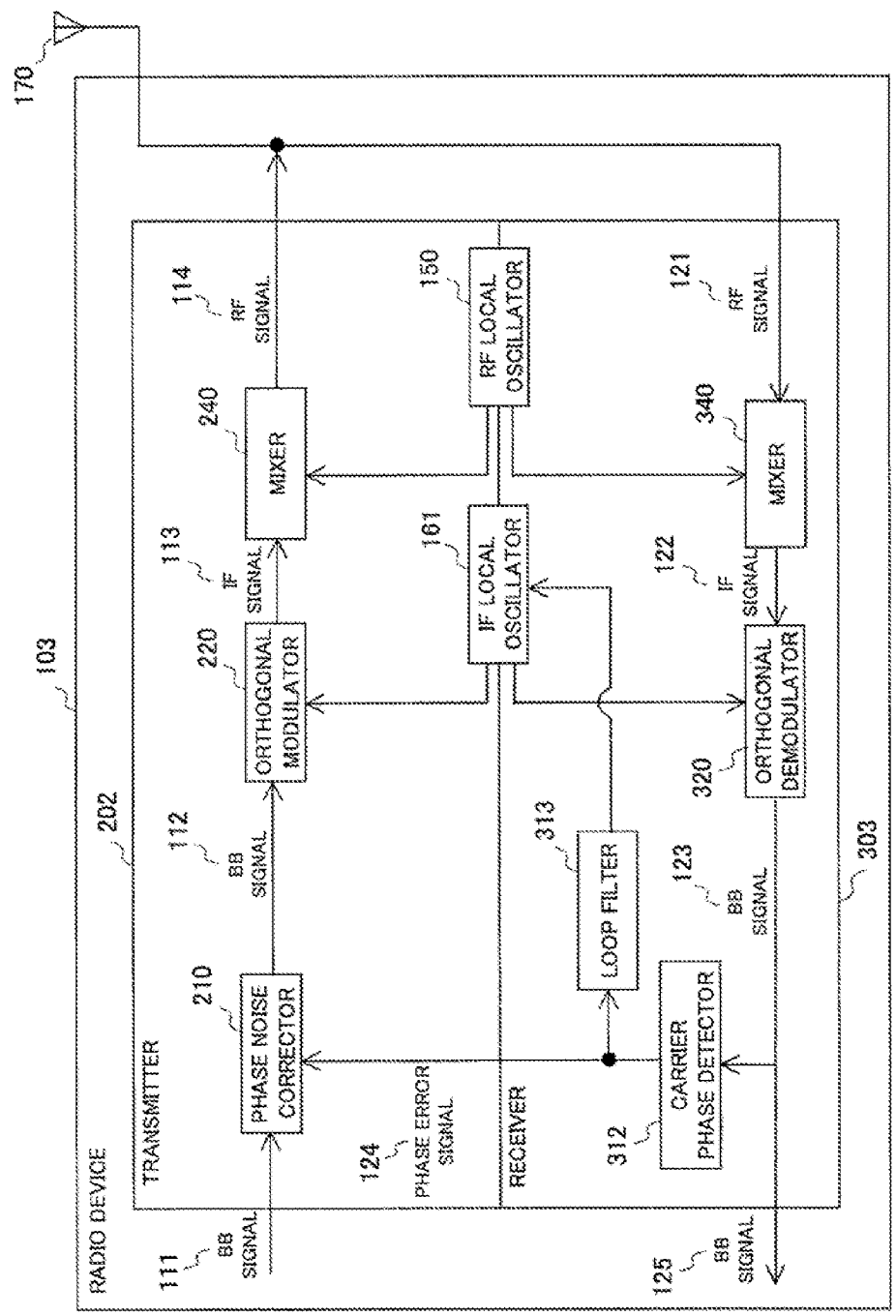
FIG. 11 A view illustrating a schematic configuration of a radio device according to a fourth exemplary embodiment of the present invention.
Figure 12A:
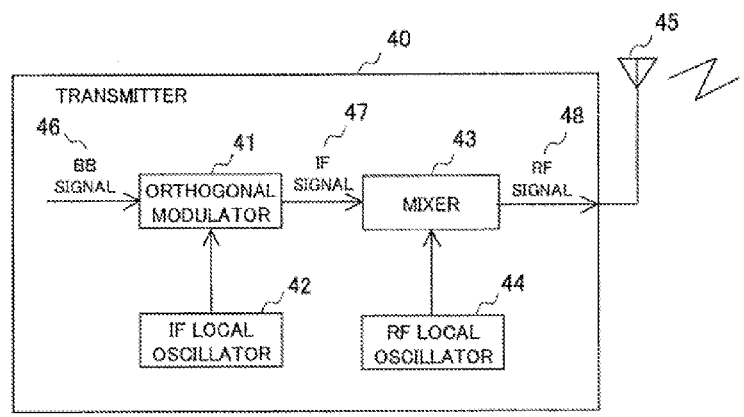
FIG. 12 A view for explaining operations of a general transmitter and a general receiver in a high-frequency radio digital communication.
Figure 12B:
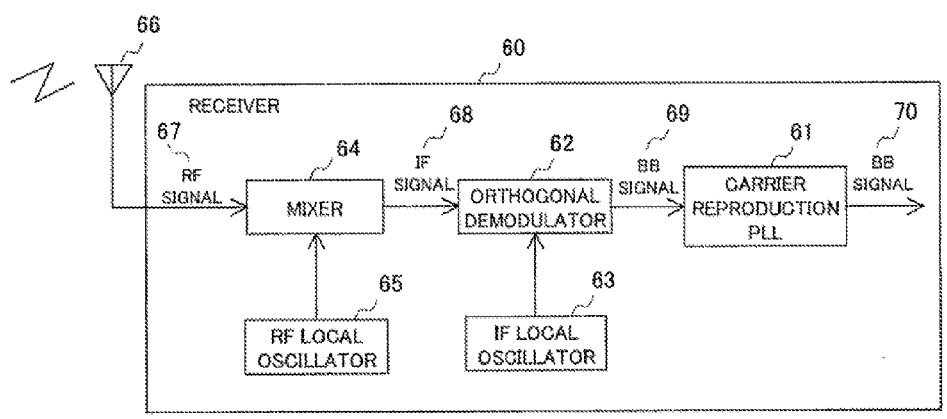

Although, in the second exemplary embodiment, the RF local oscillator 150 is shared as illustrated in FIG. 9, a configuration may be adopted in which not only the RF local oscillator but also the IF local oscillator is shared. In a fourth exemplary embodiment of the present invention, the transmitter 202 and a receiver 303 of a radio device 103 share the RF local oscillator 150 and an IF local oscillator 161 as illustrated in FIG. 11.

Also in the present exemplary embodiment, as in the case of the third exemplary embodiment, the phase noise corrector 210 of the transmitter 202 corrects the phase error generated in the RF local oscillator 150 and phase error generated in the IF local oscillator 161. The phase noise generated in the IF local oscillator 161 is sufficiently smaller than the phase noise generated in the RF local oscillator 150, so that even in the configuration where the IF local oscillator is shared, the same phase noise correction effect as obtained by the correction method of the second exemplary embodiment can be obtained. The frequency error correction performed in the receiver 303 is the same as in the second exemplary embodiment and the description thereof is omitted here.

In the present exemplary embodiment, as in the case of the second exemplary embodiment that adopts the synchronous detection method, it is possible to directly correct the frequency error in such a manner as to prevent the frequency error from being generated in the IF local oscillator. Further, as in the case of the third exemplary embodiment having the configuration in which the IF local oscillator is shared between the transmitter and receiver, it is possible to eliminate error in the frequency oscillated from the IF local oscillator which is generated between the transmitter and receiver, thereby improving the accuracy of the frequency error correction and phase noise correction. Further, in the present exemplary embodiment, the number of components can be reduced more than in the third exemplary embodiment, thereby further simplifying the configuration.

Although the representative embodiments of the present invention have been described in detail, it should be understood that various changes, substitutions and alternatives can be made therein without departing from the sprit and scope of the invention as defined by the appended claims. Further, it is the inventor's intent to retain all equivalents of the claimed invention even if the claims are amended during prosecution.

Although the above exemplary embodiments are preferred exemplary embodiments of the present invention, the present invention is not limited to the above exemplary embodiments but may be variously modified within the scope of the present invention.

The invention claimed is:

1. A phase noise correction circuit, comprising:
a phase error information acquisition unit that is provided in a transmitter of a radio device and acquires phase error information detected by a receiver of the radio device; and
a phase noise correction unit that is provided in the transmitter and performs phase noise correction for a baseband signal in the transmitter upon radio transmission by using the phase error information acquired by the phase error information acquisition unit, the phase noise to be corrected by phase noise correction unit being phase noise generated by a local oscillator shared between the receiver and the transmitter.

2. The phase noise correction circuit according to claim 1, wherein
the phase noise correction unit uses the phase noise included in the phase error information and generated by the local oscillator upon radio reception of the receiver to add reverse characteristics of the phase noise to the baseband signal in the transmitter upon radio transmission.

3. The phase noise correction circuit according to claim 1, wherein
the phase error information acquisition unit includes a time averaging unit that performs time averaging processing for the phase error information including thermal noise and phase error to extract the phase noise from the phase error information while removing the thermal noise.

4. The phase noise correction circuit according to claim 1, wherein
the phase error information acquisition unit includes a phase noise characteristics acquisition unit that acquires, as characteristics of phase noise generated by the local oscillator upon radio reception which is included in the phase error information, rotation angle information of the phase noise.

5. The phase noise correction circuit according to claim 1, wherein
the phase noise correction unit includes a complex conjugate unit that performs complex conjugate operation for a rotation angle of the phase noise generated by the local oscillator at radio reception time of the receiver which is included in the phase noise information and giving a phase rotation corresponding to the rotation angle obtained from the complex conjugate operation to the baseband signal.

6. A transmitter provided in a radio device together with a receiver comprising:
a local oscillator shared with the receiver; and
a phase noise correction circuit including
a phase error information acquisition unit that acquires phase error information detected by the receiver and
a phase noise correction unit that performs phase noise correction for a baseband signal in the transmitter upon radio transmission by using the phase error information acquired by the phase error information acquisition unit, the phase noise to be corrected by phase noise correction unit being phase noise generated by the local oscillator.

7. The transmitter according to claim 6, wherein
the phase noise correction unit uses the phase noise included in the phase error information and generated by the local oscillator upon radio reception to add reverse characteristics of the phase noise to the baseband signal in the transmitter upon radio transmission.

8. The transmitter according to claim 6, wherein
the phase error information acquisition unit includes a time averaging unit that performs time averaging processing for the phase error information including thermal noise and phase error to extract the phase error from the phase error information while removing the thermal noise.

9. The transmitter according to claim 6, wherein
the phase error information acquisition unit includes a phase noise characteristics acquisition unit that acquires, as characteristics of phase noise generated by the local oscillator upon radio reception which is included in the phase noise information, rotation angle information of the phase noise.

10. The transmitter according to claim 6, wherein
the phase noise correction unit includes a complex conjugate unit that performs complex conjugate operation for a rotation angle of the phase noise generated by the local oscillator upon radio reception which is included in the phase noise information and giving a phase rotation corresponding to the rotation angle obtained from the complex conjugate operation to the baseband signal.

11. A radio device provided with a transmitter and a receiver, wherein the receiver comprises:
a first local oscillator shared with the transmitter; and
a frequency error correction circuit including a phase error information detection unit that detects phase error information including phase noise generated by the local oscillator upon radio reception, and
the transmitter comprises:
the first local oscillator shared with the receiver; and
a phase noise correction circuit including
a phase error information acquisition unit that acquires the phase error information detected by the phase error information detection unit and
a phase noise correction unit that performs phase noise correction for a baseband signal in the transmitter upon radio transmission by using the phase error information acquired by the phase error information acquisition unit, the phase noise to be corrected by the phase noise correction unit being phase noise generated by the first local oscillator.

12. The radio device according to claim 11, wherein
the phase noise correction unit uses the phase noise included in the phase error information and generated by the first local oscillator upon radio reception to add reverse characteristics of the phase noise to the baseband signal in the transmitter upon radio transmission.

13. The radio device according to claim 11, wherein
the frequency error correction circuit includes a frequency error acquisition unit that extracts a low-frequency phase error component from the phase error information detected by the phase error information detection unit and acquires frequency error included in the extracted phase error component.

14. The radio device according to claim 11, wherein
the phase error information acquisition unit includes a time averaging unit that performs time averaging processing for the phase error information including thermal noise and phase error to extract the phase noise from the phase error information while removing the thermal noise.

15. The radio device according to claim 11, wherein
the phase error information acquisition unit includes a phase noise characteristics acquisition unit that acquires, as characteristics of phase noise generated by the first local oscillator upon radio reception which is included in the phase error information, rotation angle information of the phase noise.

16. The radio device according to claim 11, wherein
the phase noise correction unit includes a first complex conjugate unit that performs complex conjugate operation for a rotation angle of the phase noise generated by the first local oscillator upon radio reception which is included in the phase noise information and giving a phase rotation corresponding to the rotation angle obtained from the complex conjugate operation to the baseband signal.

17. The radio device according to claim 11, wherein
the frequency error correction circuit includes
a frequency error characteristics acquisition unit that acquires, as characteristics of frequency error generated by the first local oscillator upon radio reception which is included in the phase error information, rotation angle information of the frequency error and
a second complex conjugate unit performs complex conjugate operation for the rotation angle acquired as the angle information by the frequency error characteristics acquisition unit and gives a phase rotation corresponding to the rotation angle acquired by the complex conjugate operation to a baseband signal received by radio, and
the receiver and transmitter individually include a second local oscillator used for demodulation of an intermediate frequency signal into a baseband signal performed in the receiver and for modulation of the baseband signal into intermediate frequency signal performed in the transmitter.

18. The radio device according to claim 11, wherein
the receiver and transmitter individually include a second local oscillator used for demodulation of an intermediate frequency signal into a baseband signal performed in the receiver and for modulation of the baseband signal into intermediate frequency signal performed in the transmitter, and
the second local oscillator adjusts the frequency to be oscillated based on the frequency error generated by the first oscillator upon radio reception which is included in the phase error information.

19. The radio device according to claim 11, wherein
the frequency error correction circuit includes
a frequency error characteristics acquisition unit that acquires, as characteristics of frequency error generated by the first local oscillator upon radio reception which is included in the phase error information, rotation angle information of the frequency error and
a second complex conjugate unit that performs complex conjugate operation for the rotation angle acquired as the angle information by the frequency error characteristics acquisition unit and gives a phase rotation corresponding to the rotation angle acquired by the complex conjugate operation to a baseband signal received by radio, and
the receiver and transmitter share a second local oscillator used for demodulation of an intermediate frequency signal into a baseband signal performed in the receiver and for modulation of the baseband signal into intermediate frequency signal performed in the transmitter.

20. The radio device according to claim 11, wherein
the receiver and transmitter share a second local oscillator used for demodulation of an intermediate frequency signal into a baseband signal performed in the receiver and for modulation of the baseband signal into intermediate frequency signal performed in the transmitter, and
the second local oscillator adjusts the frequency to be oscillated based on the frequency error generated by the first oscillator upon radio reception which is included in the phase error information.

* * * * *